United States Patent
Delos et al.

(10) Patent No.: US 10,097,219 B1
(45) Date of Patent: Oct. 9, 2018

(54) METHOD AND SYSTEM FOR REDUCING DIRECT DIGITAL SYNTHESIZER (DDS) AND MIXER SPURIOS

(71) Applicant: Lockheed Martin Corporation, Bethesda, MD (US)

(72) Inventors: Peter L. Delos, Mount Laurel, NJ (US); Douglas A. Leonard, Jr., Cherry Hill, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 474 days.

(21) Appl. No.: 14/486,355

(22) Filed: Sep. 15, 2014

(51) Int. Cl.
  *G06F 13/38* (2006.01)
  *H04B 1/04* (2006.01)

(52) U.S. Cl.
  CPC .................. *H04B 1/0475* (2013.01)

(58) Field of Classification Search
  None
  See application file for complete search history.

(56) References Cited

U.S. PATENT DOCUMENTS

2011/0181468 A1* 7/2011 Sun .................. G01S 19/30
  342/357.73
2015/0295566 A1* 10/2015 Ficici .................. H03K 5/1252
  327/551

OTHER PUBLICATIONS

Reinhardt, V.S., "Spur Reduction Techniques in Direct Digital Synthesizers", IEEE Frequency Control Symposium, 1993.
Huntley, Roger, Gentile, Ken, "Signal Cancellation Improves DDS SFDR", Microwaves & RF, Aug. 18, 2006.
Vankka, Jouko, "Direct Digital Synthesizers: Theory, Design, and Applications," Helsinki University of Technology, Department of Electrical and Communication Engineering, Electrical Circuit Design Laboratory, Nov. 2000, pp. 63-78.

* cited by examiner

*Primary Examiner* — Scott Sun
(74) *Attorney, Agent, or Firm* — Howard IP Law Group, PC

(57) ABSTRACT

A waveform generator circuit provides low spurious output signal and includes a primary DDS for generating a RF signal at a first frequency. A DAC receives an output signal from the primary DDS and converts the digital DDS output to an analog output. A spectrum analyzer identifies spurious signals in the DAC output determining the amplitude and frequency characteristics of the spurious signals. The waveform generator includes at least one cancellation DDS configured to generate a pre-distortion signal corresponding to frequencies where spurious signals are expected due to non-linearities in the DAC circuitry. The pre-distortion signals are phase offset from the determined spurious signals to cancel the spurious signals. The pre-distortion signals are combined with the output of the primary DDS. The combined signal contains the primary DDS output signal and pre-distortion signals to produce an analog output signal which cancels out the expected spurious signals.

18 Claims, 5 Drawing Sheets

METHOD AND SYSTEM FOR REDUCING DIRECT DIGITAL SYNTHESIZER (DDS) AND MIXER SPURIOS

FIELD OF THE INVENTION

This application relates to waveform generators. More particularly, this application relates to direct digital synthesizers (DDS) for generating waveforms.

BACKGROUND OF THE INVENTION

DDS waveform generation has become the standard method for generation of complex modulated waveforms. DDSs are a primary building block for modern waveform generators. Typically, the DDS generates the modulated waveform and a frequency translation is performed to up-convert the signal to a frequency within the operating band. Up-conversion may be performed through frequency multiplication or frequency mixing. Frequency multiplication is a convenient method for increasing frequency and expanding bandwidth. However, frequency multiplication suffers a 20 log N degradation to both phase noise and spurious in the output. Frequency mixing is typically used for narrow bandwidth applications. In wideband applications, frequency mixing produces spurious mixing products that become a significant limitation for spurious performance for wide bandwidths.

When considering performance of DDSs, emission of spurious signals in the output is an important consideration as low spectral purity is a primary performance metric. Spurious signals may result from either non-linearities in the DDS itself or spurious energy signals may be created in other devices that perform the frequency translation (e.g. a frequency mixer). For example, where frequency mixing is performed, mixing products create spurious signals due to the multiplication of local oscillator (LO) and intermediate frequency (IF) (e.g. clock frequency of the DAC) harmonics. These spurious products occur at frequencies that are integer multiples of the LO frequency and the IF frequency according to:

$$mLO+/-nIF$$

where m and n represent multiples of the LO frequency and IF frequency, respectively.

The implications of these spurious signals in system development require the development of a frequency plan which accounts for anticipated spurious signals. Selection of LO/IF clock frequencies, filters, etc. are directed to minimizing in-band spurious while meeting operation band requirements. For narrow band applications, available components are adequate to meet low spurious performance. However, in wideband applications, currently available components are inadequate to provide needed spurious performance. Furthermore, the DDS spurious may be directly in band, thereby presenting additional problems.

Alternative methods and devices which address spurious energy signals in waveform generators are desired.

SUMMARY

A waveform generator circuit provides low spurious output signal and includes a primary DDS for generating a radio frequency (RF) signal at a first frequency. A DAC receives an output signal from the primary DDS and converts the digital DDS output to an analog output signal. A spectrum analyzer identifies spurious signals in the DAC output to determine the amplitude and frequency characteristics of the spurious signals. The waveform generator includes at least one cancellation DDS which is configured to generate a pre-distortion signal corresponding to frequencies where spurious signals are expected due to non-linearities in the DAC circuitry. The pre-distortion signals are phase offset from the determined spurious signals to cancel the spurious signals. The pre-distortion signals are combined with the output of the primary DDS. The combined signal containing the primary DDS output signal and the pre-distortion signals are provided to the DAC to produce an analog output signal, which cancels out the expected spurious signals.

The waveform generator includes a local oscillator (LO) which generates a LO clock signal at a first LO clock frequency. The LO clock frequency is adjusted to produce an input clock signal to the DAC at a DAC clock frequency. The frequency from the LO is adjusted such that the DAC clock frequency is an integer multiple, or alternatively, an integer fraction of the LO clock frequency. A frequency mixer is used to up-convert the DDS output signal from a first frequency to a second frequency that is in an operating band of interest at a frequency higher than the first frequency of the DDS output signal. An observation receiver receives the output from the mixer, and acts as a sensor for spurious signals in the mixer output signal. The spurious signals include spurious energy signals due to non-linearities in the DAC circuitry, as well as harmonic mixer products occurring at frequencies related to the LO clock frequency and the DAC clock frequency. As the LO clock frequency and the DAC clock frequency are related as even multiples of each other, the harmonic mixer products overlap in frequency with the spurious products due to non-linearities in the DAC circuitry, simplifying the removal of both the DAC non-linearity spurious and the mixer products spurious.

DETAILED DESCRIPTION

Figure 1:
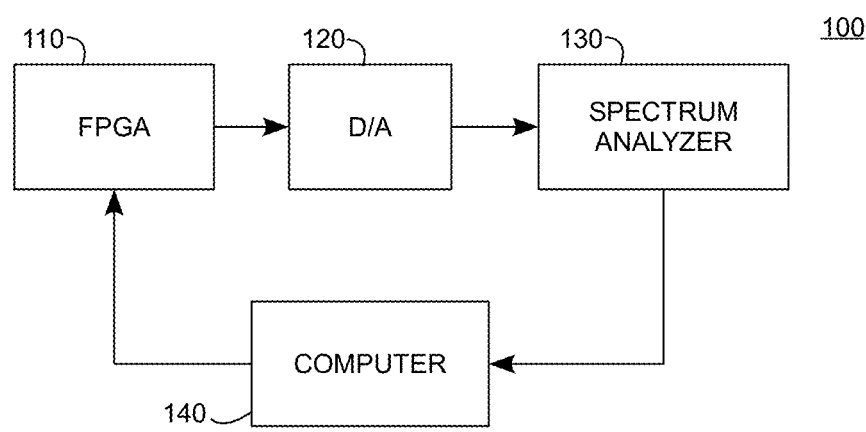
FIG. 1 is a block diagram of a conventional calibration technique for addressing spurious signals attributable to non-linearity in the DAC.

FIG. 1 is a block diagram of major components and illustrating a conventional process for correcting digital to analog converter (DAC) spurs using a factory calibration and pre-distortion. Pre-distortion has been used as a technique for reducing spurious emissions due to non-linearity in the DAC of the DDS. During bench testing, a spectrum analyzer 130 is used to observe the output of the DAC 120 and to identify spurious emissions generated by the DAC 120. Spurs typically occur at harmonic frequencies related to the DAC 120 output (e.g. clock) frequency. The spurs are identified, and coefficients are calculated by a computer 140. The coefficients are used by the waveform generator, which may be implemented, at least in part, in a field programmable gate array (FPGA) 110, to produce a pre-distortion signal that is equal in amplitude to the spur, but opposite in phase. The pre-distortion signal is mixed with the DAC 120 output, which effectively cancels out the spurious emissions. While the process 100 may address some non-linearity problems due to the DAC at the time of manufacture, the additional analog components requiring correction make it unlikely that a factory calibration will hold over the life of the device. Therefore, a factory calibration is of limited use in minimizing spurious signals, particularly in a wideband application.

Most spurious of concern are harmonically related to the DAC clock and to the frequency applied to the DDS by the local oscillator (LO). Therefore, the frequencies of these spurious may be characterized according to:

$$mLO+/-nIF \qquad \text{Equation (1)}$$

where m and n are integers;
LO is the Local Oscillator clock; and
IF is the DDS $1^{st}$ Nyquist zone frequency (e.g. the DAC clock frequency).

Since the spurious frequencies may be determined a priori according to Equation 1, signals may be generated that are equal in amplitude and opposite in phase to expected spurious results, which cancel the spurs through destructive interference.

A DDS generates signals at desired frequencies by calculating a digital code word representative of the sine wave to be generated as the input of the DAC 120. The DAC 120 converts the digital code word to an analog signal representing the sine wave represented by the digital code word. As stated above with regard to FIG. 1, non-linearities in the DAC circuitry create spurious signals in the DDS output. Furthermore, the DDS output must be up-converted to the desired operating band at a higher frequency than the DDS output signal. Up-conversion may be performed using frequency multiplication. However, frequency multiplication results in a 20 log N degradation in phase noise for each step increase in frequency. Alternatively, frequency mixing may be performed to up-convert the DDS output to the desired operation band. Mixers create spurious signals in the output of the waveform generator occurring at harmonic frequencies relating to the LO clock frequency and the DAC clock frequency. The spurious signals are produced at frequencies according to the relationship of Equation 1. In wideband applications, mixer spurious signals become a major limitation to satisfactory waveform generator performance.

Figure 2:
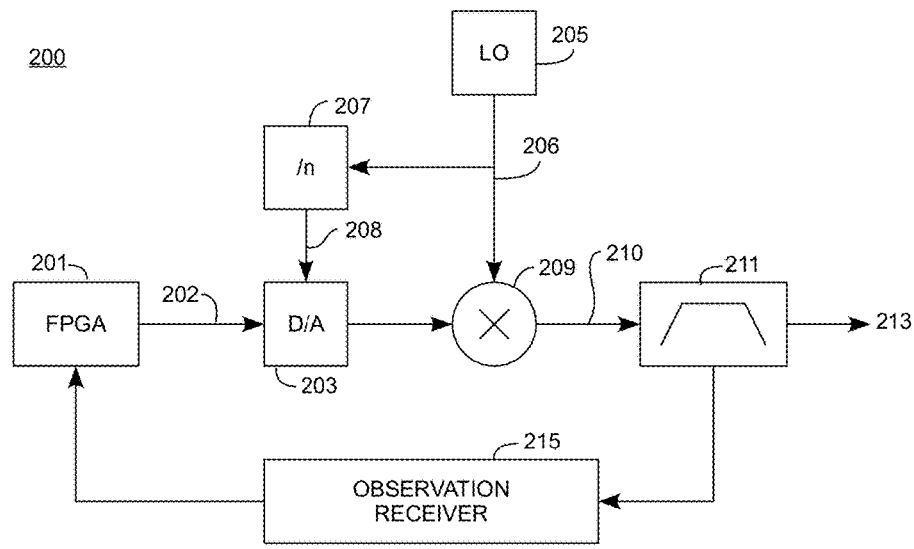
FIG. 2 is a block diagram of waveform generator configured to performing in-system spur cancellation according to an embodiment of the disclosure.

FIG. 2 shows a waveform generator 200 configured to perform in-system spurious cancellation according to an embodiment of the disclosure. The waveform generator 200 provides in-system cancellation of both spurious products due to non-linearity in the DAC 203, as well as harmonic mixer products created by the mixer 209. The waveform generator 200 includes a DDS implemented in an FPGA 201. The FPGA 201 provides a digital signal or code word 202 that is representative of a desired frequency signal. The digital code word 202 is provided to DAC 203. The local oscillator (LO) 205 provides its clock signal 206 to mixer 209. In addition, LO 205 provides an adjusted clock signal 208 to the DAC 203 via a frequency adjuster 207. The frequency adjuster 207 is configured to receive the clock signal 206 from the LO 205 and to produce the adjusted DAC input clock signal 208 at a frequency that is an even or direct factor of the DAC 203 clock frequency (as indicated by the /n designation). While the embodiment shown in FIG. 2 is shown providing a DAC clock 208 frequency which is an integer fraction of the LO 205 clock signal, the DAC 203 clock signal 208 frequency may also be adjusted to be an even multiple of the LO 205 clock signal 206 frequency. The DAC 203 receives the digital code word 202 from the FPGA 201 and outputs an analog output signal 210 to mixer 209. Mixer 209 receives the analog output signal 210 from the DAC 203 and the LO 205 clock signal 206 and up-converts the analog output 210 of the DAC 203 to the operating band. The up-converted output is passed through a band pass filter 211 to produce the up-converted output signal 213 in the desired operating band. Spurious signals may be included in the up-converted output signal 213 due to non-linearity in the DAC 203 and to mixing products introduced by mixer 209. These mixing products typically occur at harmonic frequencies that are multiples of the DAC 203 clock signal frequency and the LO 205 clock signal 206 frequency according to Equation 1.

Figure 3:
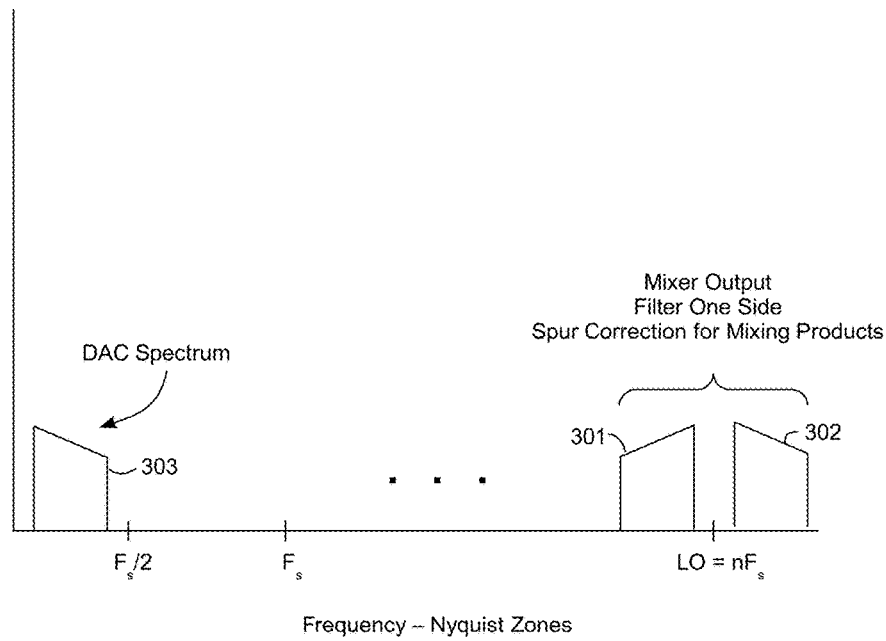
FIG. 3 is a graphical depiction of an up-converted signal such as a signal generated by the waveform generator of FIG. 2.

The DAC 203 is configured to generate a tone in the first Nyquist zone ($F_s/2$, shown in FIG. 3) where the DAC performance is highest. When a tone is generated in the first Nyquist zone, additional energy will show up in other, higher frequency Nyquist zones. Those additional energy signals must be filtered out of the output 213. Without making provisions for these additional signals, the power level of the signals in the higher Nyquist zones is too low to be useful. However, if the energy level of these spurs exceeds a certain threshold, the spurious signals create interference, which affects the performance of the wave generator 200. Known methods of performing signal modulation in the higher Nyquist zones are generally analogous to some form of frequency mixing with the local clock. When the clock frequency of the DAC 203 is maintained to be an integer multiple or integer fraction of the LO 205 clock signal 206 as shown in FIG. 2 via frequency adjuster 207, the output of the mixer 209 creates an upper and lower side band (301 and 302, respectively, shown in FIG. 3) at a higher Nyquist zone that corresponds to the first Nyquist zone 303 (shown in FIG. 3) of the DAC 203. By ensuring that the DAC clock signal 208 frequency is an integer fraction or multiple of the LO clock signal 206 frequency, the location of spurious signals due to the DAC 203 and spurious signals due to harmonic mixer products created by the mixer 209 overlap in frequency. Accordingly, a frequency plan may be developed to cover a wider range of frequencies than previously achievable where the number of resulting mixing spurious products is too large.

An observation receiver 215 is configured to receive the output 213 of wave generator 200 from bandpass filter 211 and to act as a sensor for detecting spurious performance. The goal of the observation receiver 215 is to determine the amplitude of various spurious tones and use that information in a closed loop calibration with the FPGA 201. The observed amplitude and frequency of each spurious signal is stored in an amplitude and frequency vector which is provided back to the FPGA 201. Accordingly, the observation receiver 215 is configured to tune away from the fundamental carrier, block that carrier, and measure only the spurious output levels. To do this, the observation receiver 215 requires little instantaneous dynamic range, but exhibits good total dynamic range, which may be achieved using digital attenuators. The expected spur frequencies are known a priori, so the observation receiver 215 does not require wide bandwidth, but merely a wide tuning range. The observation receiver 215 may be implemented as a separate circuit that includes a down-converter and an analog to digital converter (ADC). The digital data from the ADC is processed by the FPGA. The FPGA uses fast Fourier transform (FFT) to identify the frequencies represented in the digital data. Identified spurs are cancelled using the pre-distortion techniques described above. The observation receiver 215 exhibits relaxed requirements which allow for the miniaturization of the observation receiver 215 circuit which may be implemented in a relatively small footprint within an integrated circuit.

Figure 4:
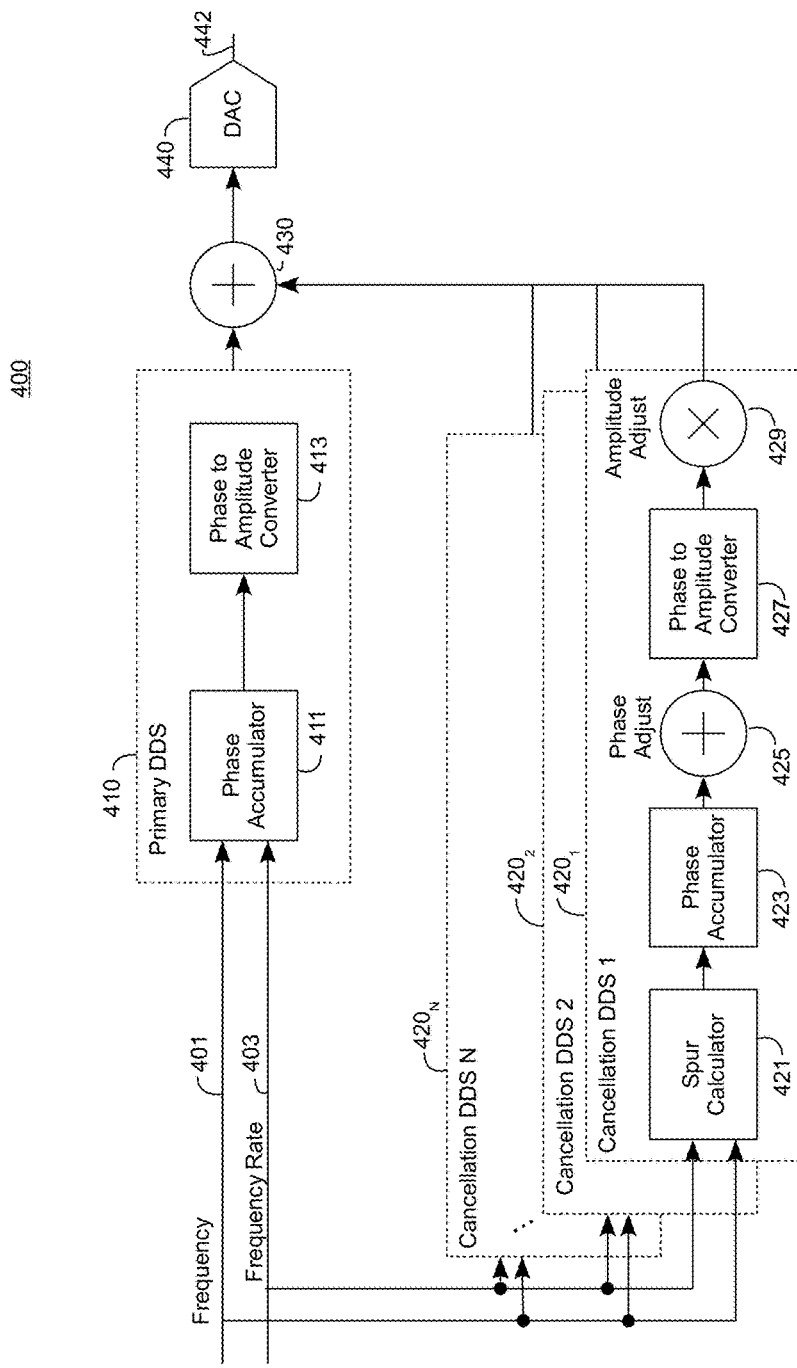
FIG. 4 is a block diagram of a wave generated with a primary DDS and a plurality of cancellation DDSs according to an embodiment of the disclosure.

FIG. 4 is a block diagram of a DDS 400 configured for providing pre-distortion cancellation of spurious signals attributable to DAC 440 non-linearity according to an embodiment of the disclosure. The DDS 400 includes a primary DDS 410 that receives a frequency 401 and a frequency rate 403 signal to a phase accumulator 411. The phase accumulator 411 accumulates the phase of the DDS waveform signal and provides the phase information to a phase to amplitude converter 413. The phase to amplitude converter 413 outputs a digital code word representative of the frequency 401 and frequency rate 403. The digital code word is combined by summing circuit 430 with one or more pre-distortion signals, as explained in detail hereinbelow, before being input to a DAC 440 for conversion to an analog signal 442 representative of the combined digital code word.

DDS 400 further includes a plurality of cancellation DDS's denoted 420₁-420_N. Each cancellation DDS 420 is associated with an expected spurious frequency and receives the frequency 401 and frequency rate 403 signals at a spur calculator 421. The spur calculators 421 of the DDS's 420 perform mathematic calculations to determine specific frequencies at which spurious signals are expected to arise due to the non-linearity of the DAC 440 as a function of the input frequency 401 and frequency rate 403. The expected spurious signals due to non-linearity of the DAC 440 may be determined a priori through bench testing of the DDS 400. During fabrication, a spectrum analyzer is attached to the output of the DAC 440 and spurious signals are measured and identified for a range of frequencies within a wideband operating frequency band. The measured spurious represents the spurious signals created due to the non-linearity in the DAC circuitry. Spur calculator 421 uses the identified frequencies associated with spurious signals occurring at the input frequency 401 and frequency rate 403 to calculate a pre-distortion frequency signal. The pre-distortion signals from all the cancellation DDSs 420 are combined with the primary DDS 410 output signal in summing circuit 430. The combined output provides cancellation of the expected spurious signals for the input frequency 401 and frequency rate 403.

The spur calculator 421 provides the calculated pre-distortion frequency signal to phase accumulator 423, which accumulates the phase information for the pre-distortion signal associated with the particular cancellation DDS 420. The accumulated phase information is provided to phase adjuster 425, which adjusts the phase of the pre-distortion signal so that it is out of phase with the target spurious signals being generated in the DAC 440. The adjusted phase information is provided to a phase to amplitude converter 427 and the amplitude of the pre-distortion signal is adjusted in amplitude adjuster 429. The phase and amplitude of the pre-distortion signal is configured to be substantially equal in amplitude to the expected spurious signal and opposite in phase. The resulting adjusted pre-distortion signal is output from the cancellation DDS 420 and combined with the output of primary DDS 410 in summing circuit 430. Accordingly, the pre-distortion signal information is provided as a binary word that is combined with the binary word created as output of the primary DDS 410 as a new combined binary word. The combined binary word is then converted to an analog signal in the DAC 440. The DAC 440 outputs an analog signal containing the pre-distortion signal information. The resulting analog signal cancels the spurious signals created in the DAC 440 due to the non-linearity of the DAC 440 circuitry.

According to an exemplary embodiment that uses a continuous wave (CW) waveform, the amplitude and phase modulated wave may be written according to Equation (2):

$$a_c(t)\cos[2\pi f_c t + \phi_c(t)] \qquad \text{Equation (2)}$$

where $f_c$ is the carrier frequency of the primary waveform;
$a_c(t)$ represents the amplitude of the primary waveform and can be modulated as a function of time; and
$\phi_c(t)$ represents any phase modulation applied to the primary waveform.

The spur cancelling waveform for the CW may be determined by:

$$a(a_c, f_c)\cos[2\pi f_s(f_c, t) + k\phi_c(t) + \phi_s(f_c)] \qquad \text{Equation (3)}$$

where $a(a_c, f_c)$ is the amplitude term and represents the fact that the amplitude of the spur cancelling waveform varies based on the instantaneous frequency $f_c$ and the amplitude of the primary waveform;
$f_s$ is the instantaneous frequency of the spur. For a fixed DDS clock frequency, it is a function of the instantaneous frequency of the primary waveform;
$k\phi_c(t)$ is a multiple of the phase modulation applied to the primary waveform; and
$\phi_s(f_c)$ is the phase determined from an empirical calibration required to cancel the spurs from the primary waveform.

According to another embodiment using a linear frequency modulated (LFM) waveform, the LFM waveform may be written as:

$$\cos[2\pi f_1 t + \pi(B/T)t^2] \qquad \text{Equation (4)}$$

where $f_1$ is the start frequency of the LFM waveform; and
$\pi(B/T)t^2$ is the LFM modulation term at a rate of B/T.

The spur cancelling waveform for the LFM waveform may then be written according to:

$$a(f_{LFM})\cos[2\pi f_2 t + k\pi(B/T)t^2 + \phi(f_{LFM})] \qquad \text{Equation (5)}$$

where $f_2$ is the start frequency of the spur cancelling waveform,
$k\pi(B/T)t^2$ is the LFM modulation term at a rate of the spur The spur will move in frequency at a multiple of the chirp rate (B/T) and the multiple is represented by the constant k. This constant arises from the harmonic relation of the spurious (mLO+/−nIF). The k value corresponds to the multiple of the mixing product (nIF) that gives rise to this spurious signal.

$a(f_{LFM})$ and $\phi(f_{LFM})$ are the amplitude and phase, respectively of the spur cancelling waveform, which are a function of frequency. A calibration must be performed to determine these terms.

In order to perform cancellation, the cancelling waveform must be substantially matched to the undesired signal in amplitude and opposite phase.

Figure 5:
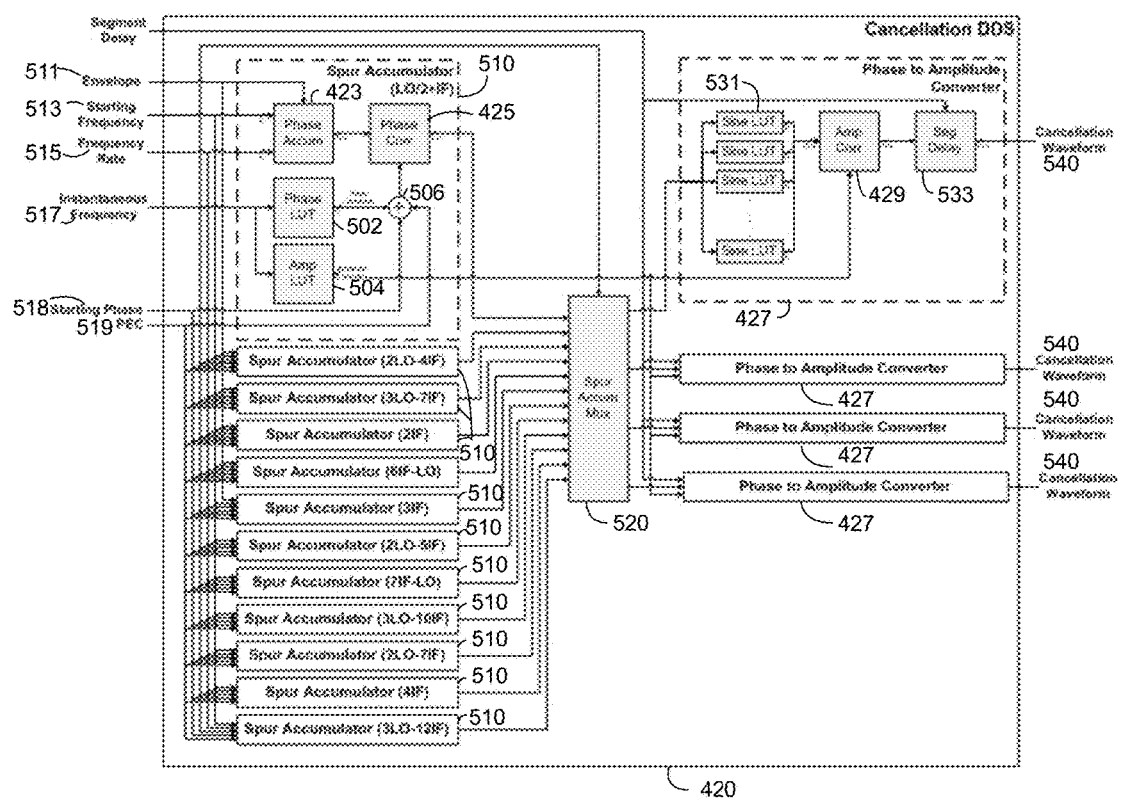
FIG. 5 is a block diagram of a cancellation DDS as shown in FIG. 4.

Referring now to FIG. 5, a block diagram of a cancellation DDS 420 according to an embodiment of the disclosure is shown. The cancellation DDS 420 may be used along with the observation receiver (215, shown in FIG. 2) to provide in-system correction of both DAC spurious and spurious due to mixer products. A plurality of spur accumulators 510 are provided. Each spur accumulator 510 is associated with one of a plurality of frequencies containing expected spurious signals. The expected spurious signals correspond to a group of frequencies characterized as the sum or difference of multiples of the DAC clock (208, shown in FIG. 2) frequency and multiples of the LO clock signal (206, shown in FIG. 2) frequency according to Equation 1. The spur accumulators 510 each receive envelope information 511, starting frequency 513, frequency rate 515, the instantaneous frequency 517 of the DDS, starting phase information 518, and a phase error correction value 519. The envelope information 511, starting frequency 513 and frequency rate 515 are input to phase accumulator 423. The output of the phase accumulator 423 is provided to phase adjuster 425. The instantaneous frequency 517 is provided to phase lookup table 502 and amplitude lookup table 504. The phase and amplitude lookup tables 502, 504 determine phase and amplitude values based on the instantaneous frequency 517. The phase and amplitude values are provided to the phase adjuster 425 and the amplitude adjuster 429, respectively. The output of the phase lookup table 502 and the phase error correction value 519 are combined 506 and provided to the phase adjuster 425. The output of the phase adjuster 425 of each spur accumulator 510 is then output to a multiplexer 520. It may be observed, that at any given instantaneous frequency 517, at most four (4) of the expected spurious frequencies associated with spur accumulators 510 will be in band for the given instantaneous frequency 517. Therefore, although each spur accumulator 510 accumulates the phase information for its associated spurious frequency, only the spurious frequencies determined to be in band for the current instantaneous frequency 517 need to be corrected by generation of a corresponding pre-distortion signal 540. Therefore, multiplexer 520 includes four outputs that are provided to four corresponding phase to amplitude converters 427. The multiplexer 520 provides adjusted phase information for the up to four of the spur accumulators 510 associated with spurious frequencies determined to be in band at the present instantaneous frequency 517. The adjusted phase information is provided to sine lookup tables 531 to provide a digital code word representative of the cancellation waveform or pre-distortion signal 540. The digital code word is provided to amplitude adjuster 429 along with the amplitude lookup value from amplitude lookup table 504 in the spur accumulator 510. A segment delay 533 is applied to provide timing information to ensure that the cancellation waveform is output in time corresponding to the expected spurious signal. The cancellation waveforms (e.g. pre-distortion signals 540) are provided to a combiner (430, shown in FIG. 4) along with the primary DDS output. The final digital code word is provided to the DAC 440 (shown in FIG. 4) to produce the analog signal corrected for non-linearity in the DAC and mixer products via the observation receiver of FIG. 2. The pre-distortion correction produces a low spurious output waveform 442 (shown in FIG. 4).

Figure 6:
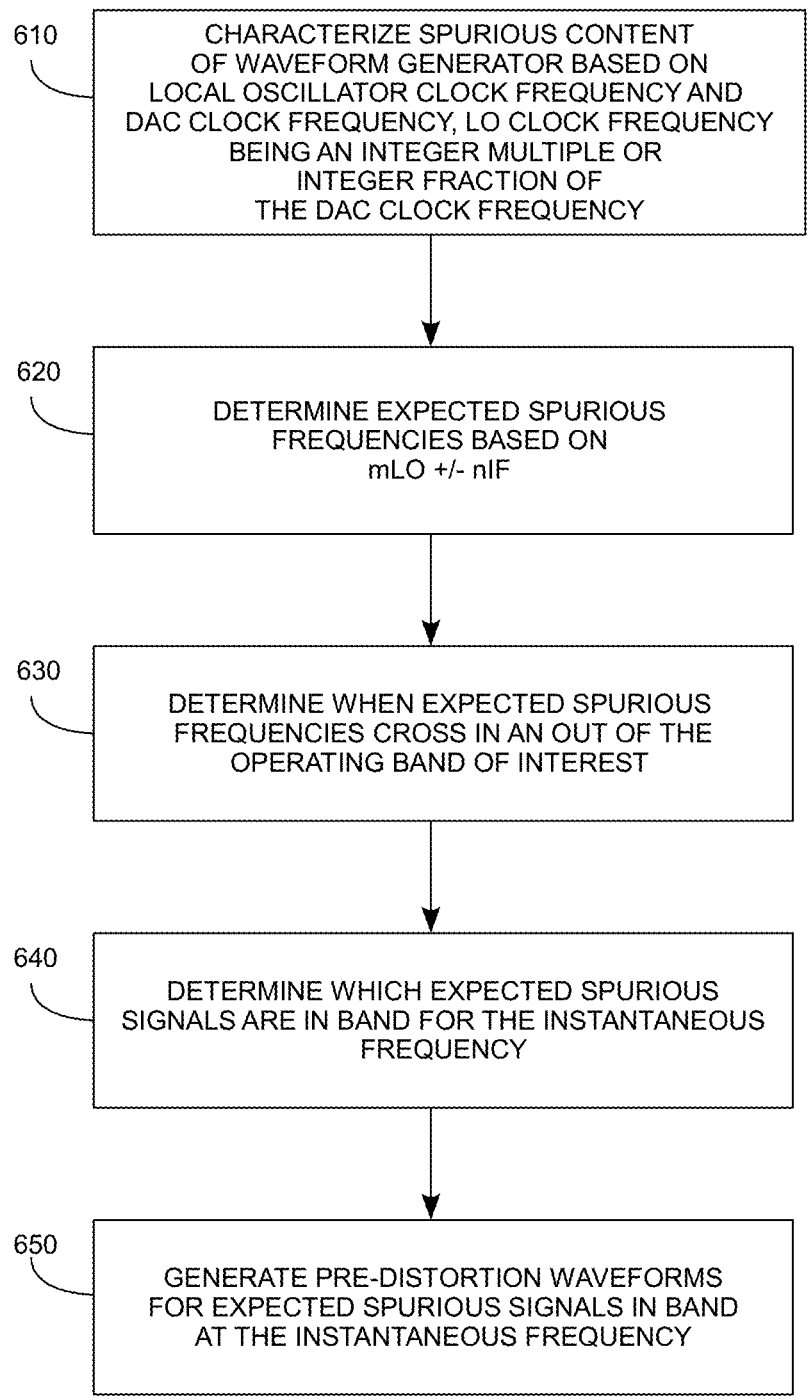
FIG. 6 is a process flow diagram of a method of producing low spurious signals from a waveform generator according to an embodiment of the present invention.

Referring now to FIG. 6, a process flow of a method for producing a waveform generator output having low spurious according to an embodiment of the disclosure is shown. The spurious content of the waveform generator is characterized based on the clock frequency of the local oscillator clock and the DAC clock where the DAC clock frequency is an integer multiple or an integer fraction of the LO clock frequency (block 610). The expected spurious signals are determined for the given LO clock frequency and the DAC clock frequency according to the equation, mLO+/−nIF (block 620). It is then determined across the operating bandwidth when the expected spurious signals cross into and out of band (block 630). For a current instantaneous frequency of the DDS, it is determined which of the expected spurious are in band for the instantaneous frequency (block 640). Pre-distortion signals corresponding to the expected in-band spurious signals are generated to cancel the expected spurious signals determined to be in band at the instantaneous frequency (block 650).

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A circuit for performing frequency generation with low spurious comprising:
 a waveform generator comprising:
  a primary direct digital synthesizer (DDS) for generating a radio frequency (RF) signal;
  a digital to analog converter (DAC) configured to receive said RF signal from said DDS and output an analog signal representative of said RF signal;
  a mixer configured to receive said output of said DAC and a local oscillator (LO) clock signal and converting the output of said DAC to a predetermined operating frequency band; and
  at least one cancellation DDS configured to generate pre-distortion signals at frequencies associated with spurious signals resulting from an operation of the mixer, said pre-distortion signals being out of phase with said spurious signals, thereby providing cancellation of the spurious signals when the pre-distortion signals are combined with said RF signal of the primary DDS.

2. The circuit of claim 1, further comprising:
 a local oscillator (LO) configured to generate the LO clock signal; and
 a frequency adjuster circuit configured to receive the LO clock signal and output an adjusted clock signal, wherein said adjusted clock signal has a frequency that is one of an even multiple of said LO clock signal frequency and an integer fraction of said LO clock signal frequency, and wherein said adjusted clock signal is provided to said DAC.

3. The circuit of claim 2, further comprising a band pass filter configured to receive an output signal of said mixer and to filter the mixer output signal to produce an upconverted output signal at a selected output frequency.

4. The circuit of claim 2, wherein spurious signals produced due to non-linearity of the DAC and spurious signals produced due to harmonic frequency mixer products contained in said mixer output occur at a set of frequencies common to both non-linearity and mixer product spurious signals.

5. The circuit of claim 2, wherein said DAC is configured to operate in a first Nyquist zone of said DAC.

6. The circuit of claim 2, further comprising an observation receiver circuit configured to:
receive an output of said mixer and analyze said mixer output to determine spurious signals contained in said mixer output;
determine an amplitude and frequency vector for each of said determined spurious signals; and
provide said amplitude and frequency vectors to the at least one cancellation DDS.

7. The circuit of claim 6, wherein said observation receiver circuit is further configured to block a carrier signal of the output of said mixer and measure an amplitude of spurious signals contained in said mixer output.

8. The circuit of claim 6, wherein said at least one cancellation DDS is configured to generate a pre-distortion signal based on receipt of an associated amplitude value and a frequency vector.

9. The circuit of claim 8, wherein said pre-distortion signal is representative of spurious energy in said mixer output due to non-linearity in the DAC circuitry and due to harmonic mixer products generated by said mixer.

10. A circuit for performing frequency generation with low spurious comprising:
a waveform generator comprising:
a primary direct digital synthesizer (DDS) for generating a radio frequency (RF) signal;
a mixer operatively connected to the DDS and configured to mix a signal indicative of said RF signal generated by said DDS with a local oscillator (LO) clock signal; and
at least one cancellation DDS configured to generate pre-distortion signals at predetermined frequencies associated with spurious signals resulting from an operation of the mixer, said pre-distortion signals being out of phase with said spurious signals, thereby providing cancellation of the spurious signals when the pre-distortion signals are combined with said RF signal of the primary DDS.

11. The circuit of claim 10, further comprising:
a digital to analog converter (DAC) configured to receive said RF signal from said DDS and output an analog signal representative of said RF signal to the mixer;
a local oscillator (LO) configured to generate said LO clock signal; and
a frequency adjuster circuit configured to receive the LO clock signal and output an adjusted clock signal, wherein said adjusted clock signal has a frequency that is one of an even multiple of said LO clock signal frequency and an integer fraction of said LO clock signal frequency, and wherein said adjusted clock signal is provided to said DAC,
wherein the mixer is configured to receive said output of said DAC and said LO clock signal to up-convert the output of said DAC to a predetermined operating frequency band.

12. The circuit of claim 11, further comprising a band pass filter configured to receive an output signal of said mixer and to filter the mixer output signal to produce an upconverted output signal at a selected output frequency.

13. The circuit of claim 11, wherein spurious signals produced due to non-linearity of the DAC and spurious signals produced due to harmonic frequency mixer products contained in said mixer output occur at a set of common frequencies.

14. The circuit of claim 11, wherein said DAC is configured to operate in a first Nyquist zone of said DAC.

15. The circuit of claim 11, further comprising an observation receiver circuit configured to:
receive an output of said mixer and analyze said mixer output to determine spurious signals contained in said mixer output;
determine an amplitude and frequency vector for each of said determined spurious signals; and
provide said amplitude and frequency vectors to the at least one cancellation DDS.

16. The circuit of claim 15, wherein said observation receiver circuit is further configured to block a carrier signal of the output of said mixer and measure an amplitude of spurious signals contained in said mixer output.

17. The circuit of claim 15, wherein said at least one cancellation DDS is configured to generate a pre-distortion signal based on an associated amplitude value and a frequency vector.

18. The circuit of claim 17, wherein said pre-distortion signal is representative of spurious energy in said mixer output due to non-linearity in the DAC circuitry and due to harmonic mixer products generated by said mixer.

* * * * *

UNITED STATES PATENT AND TRADEMARK OFFICE
CERTIFICATE OF CORRECTION

| | | |
|---|---|---|
| PATENT NO. | : 10,097,219 B1 | Page 1 of 1 |
| APPLICATION NO. | : 14/486355 | |
| DATED | : October 9, 2018 | |
| INVENTOR(S) | : Peter L. Delos and Douglas A. Leonard, Jr. | |

It is certified that error appears in the above-identified patent and that said Letters Patent is hereby corrected as shown below:

On the Title Page

Item (54), the last word in the title, "spurios", should read: "spurious."

Signed and Sealed this
Twenty-fourth Day of December, 2019

Andrei Iancu
*Director of the United States Patent and Trademark Office*